(12) United States Patent
Davies, Jr.

(10) Patent No.: US 6,963,222 B1
(45) Date of Patent: Nov. 8, 2005

(54) NON-VOLATILE PRODUCT TERM (PTERM) CELL

(75) Inventor: Thomas J. Davies, Jr., Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 125 days.

(21) Appl. No.: 10/737,286

(22) Filed: Dec. 16, 2003

(51) Int. Cl.⁷ .......................................... H03K 19/173
(52) U.S. Cl. .......................... 326/38; 326/46; 365/154
(58) Field of Search ........................... 326/37–41, 463; 365/154, 156

(56) References Cited

U.S. PATENT DOCUMENTS

| | | | |
|---|---|---|---|
| 4,809,225 A * | 2/1989 | Dimmler et al. ............. | 365/149 |
| 5,101,378 A * | 3/1992 | Radjy et al. ............ | 365/185.02 |
| 5,742,542 A * | 4/1998 | Lin et al. ............... | 365/185.08 |
| 6,294,809 B1 * | 9/2001 | Logie .......................... | 257/320 |
| 6,738,281 B2 * | 5/2004 | Yokozeki .................... | 365/145 |
| 6,822,894 B1 * | 11/2004 | Costello et al. ............. | 365/154 |
| 6,836,428 B2 * | 12/2004 | Nakura et al. ............... | 365/154 |

* cited by examiner

Primary Examiner—Don Le
(74) Attorney, Agent, or Firm—E. Eric Hoffman

(57) ABSTRACT

A non-volatile product term cell is provided having a first floating gate located over a first p-channel transistor and a first n-channel transistor, and a second floating gate located over a second p-channel transistor and a second n-channel transistor. A control gate is located over the first and second floating gates. A first tunnel oxide capacitor is coupled to the first floating gate and a second tunnel oxide capacitor is coupled to the second floating gate. A first transistor pair is coupled between the first p-channel transistor and the second n-channel transistor, and a second transistor pair is coupled between the second p-channel transistor and the first n-channel transistor. The first and second floating gates are programmed and/or erased. Complementary input signals are applied to the first and second transistor pairs. An output signal is provided in response to the programmed/erased states of the first and second floating gates.

25 Claims, 4 Drawing Sheets

NON-VOLATILE PRODUCT TERM (PTERM) CELL

FIELD OF THE INVENTION

The present invention relates to a method and structure for configuring a programmable logic device. More specifically, the present invention relates to an improved product term (pterm) cell, which replaces SRAM cells with non-volatile embedded electrically erasable (EE) memory cells.

RELATED ART

Conventional complex programmable logic devices (CPLDs), such as the COOLRUNNER™ family of CPLDs available from Xilinx, Inc., include a basic circuit block known as a product term (pterm) cell.

Conventional CPLD designs require a power-up initialization cycle. During this cycle, the contents of a non-volatile memory, such as an electrically erasable memory array, are transferred into a plurality of SRAM latches embedded in a logic core. This transfer typically occurs over a plurality of memory cycles, on an address-by-address basis. For example, a conventional CPLD may include an electrically erasable memory array that stores about 150,000 configuration values, which are loaded into corresponding latches 1500 bits at a time. Thus, 100 transfers must be made from the electrically erasable memory array to the latches in order to configure the CPLD. Once the configuration values are stored in the latches, the latches configure the logic core to implement a user-defined application.

Two drawbacks of a conventional initialization cycle are the complex circuitry required to transfer the configuration values from the electrically erasable memory array to the latches, and the relatively long time required to transfer the configuration values from the electrically erasable array to the latches. In addition, the conventional initialization process is subject to disruption from noise and variations in the power supply voltage.

It would therefore be desirable to have an improved product term cell for use in a CPLD.

SUMMARY

Accordingly, present invention provides a non-volatile product term cell having a smaller layout area than a conventional SRAM product term (pterm) cell, thereby resulting in a reduced die size. Moreover, the non-volatile pterm cell of the present invention directly applies a configuration state to the product term elements, without the need to transfer information from an electrically erasable memory cell to associated SRAM cells.

In accordance with one embodiment, the non-volatile product term cell includes a first floating gate element which forms part of a first p-channel floating gate transistor and part of a first n-channel floating gate transistor. The product term cell also includes a second floating gate element which forms part of a second p-channel floating gate transistor and part of a second n-channel floating gate transistor. A control gate is capacitively coupled to both the first and second floating gate elements. In addition, a first tunnel oxide capacitor is coupled to the first floating gate element, and a second tunnel oxide capacitor is coupled to the second floating gate element.

The sources of the first and second p-channel transistors are commonly coupled to a first voltage supply terminal, and the sources of the first and second n-channel transistors are commonly coupled to a ground supply voltage terminal. A first transistor pair, including a p-channel transistor and an n-channel transistor, is coupled between the drain of the first p-channel transistor and the drain of the second n-channel transistor. Similarly, a second transistor pair, including a p-channel transistor and an n-channel transistor, is coupled between the drain of the second p-channel transistor and the drain of the first n-channel transistor.

The first and second floating gate elements are erased by applying a high positive voltage to the control gate, grounding the tunnel oxide capacitors, and allowing the first voltage supply terminal to float. When the first floating gate element is erased, the first p-channel floating gate transistor is enabled (turned on) and the first n-channel floating gate transistor is disabled (turned off). Similarly, when the second floating gate element is erased, the second p-channel floating gate transistor is enabled and the second n-channel floating gate transistor is disabled.

The first and/or second floating gate elements can then be programmed, if desired, by applying a high positive voltage to the tunnel oxide capacitor(s) and the ground supply voltage to the control gate. When the first floating gate element is programmed, the first p-channel floating gate transistor is disabled and the first n-channel floating gate transistor is enabled. Similarly, when the second floating gate element is programmed, the second p-channel floating gate transistor is disabled and the second n-channel floating gate transistor is enabled.

An input signal ($Z_{IN}$) is applied to the gates of the transistors of the first transistor pair, and the complement of the input signal ($Z_{IN\#}$) is applied to the gates of the transistors of the second transistor pair. An output signal is provided at the common drain regions of the first and second transistor pairs in response to the input signal and the programmed/erased states of the first and second floating gate elements.

If the first and second floating gate elements are both erased, then the output signal is pulled up to the first supply voltage by either the first or second p-channel transistor (depending on the state of the input signal $Z_{IN}/Z_{IN\#}$). If the first and second floating gate elements are both programmed, then the output signal is pulled down to the ground supply voltage by either the first or second n-channel transistor (depending on the state of the input signal $Z_{IN}/Z_{IN\#}$). If the first floating gate element is erased and the second floating gate element is programmed, then the output signal is either pulled up to the first supply voltage by the first p-channel floating gate transistor, or pulled down to the ground supply voltage by the second n-channel floating gate transistor (depending on the state of the input signal $Z_{IN}$). Similarly, if the second floating gate element is erased and the first floating gate element is programmed, then the output signal is either pulled up to the first supply voltage by the second p-channel floating gate transistor, or pulled down to the ground supply voltage by the first n-channel floating gate transistor (depending on the state of the complementary input signal $Z_{IN\#}$).

In an alternate embodiment, the sources of the first and second n-channel floating gate transistors are coupled to first and second bit lines, respectively. In this embodiment, a read transistor is coupled between the output terminal and a voltage supply terminal. When the read transistor is enabled, the programmed/erased states of the first and second floating gate elements can be determined by monitoring the first and second bit lines.

The present invention will be more fully understood in view of the following description and drawings.

DETAILED DESCRIPTION

Figure 1:
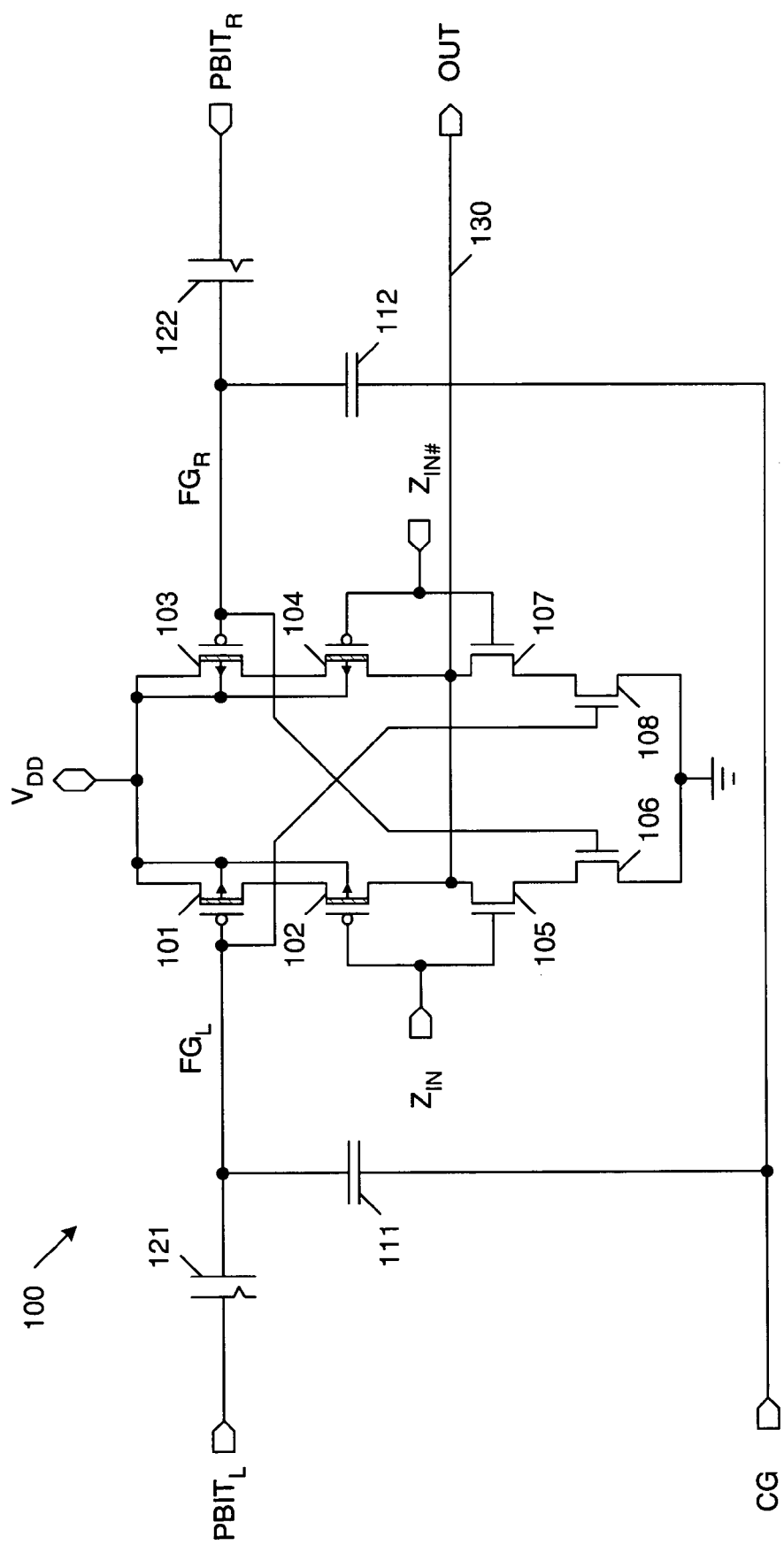
FIG. 1 is a circuit diagram of a product term cell in accordance with one embodiment of the present invention.

FIG. 1 is a circuit diagram of a symmetrical product term (pterm) cell 100 in accordance with one embodiment of the present invention. Product term cell 100 includes high-voltage p-channel transistors 101–104, n-channel transistors 105–108, capacitors 111–112, and tunnel oxide capacitor elements 121–122.

A left-side programming bit $PBIT_L$ is applied to a first terminal of tunnel oxide capacitor element 121. In the described embodiment this first terminal of tunnel oxide capacitor element 121 is formed by a conductively doped (e.g., n-type) semiconductor substrate region. A thin oxide layer (e.g., 10 Angstroms) is formed over the first terminal of tunnel oxide capacitor element 121, and a conductively doped polysilicon floating gate element $FG_L$ is formed over this thin oxide layer, thereby forming the second terminal of tunnel oxide capacitor element 121. In the described embodiment, tunnel oxide capacitor element 121 has a layout area of about 0.16 square microns. However, other sizes are possible in other embodiments.

The floating gate element $FG_L$ also forms a floating gate electrode of p-channel transistor 101, a floating gate electrode of n-channel transistor 108, and a first plate electrode of capacitor 111.

Similarly, a right-side programming bit $PBIT_R$ is applied to a first terminal of tunnel oxide capacitor element 122. In the described embodiment, tunnel oxide capacitor element 122 is substantially identical to tunnel oxide capacitor element 121. Tunnel oxide capacitor element 122 includes a conductively doped polysilicon floating gate element $FG_R$. This floating gate element $FG_R$ also forms a floating gate electrode of p-channel transistor 103, a floating gate electrode of n-channel transistor 106, and a first plate electrode of capacitor 112. The second plate electrodes of capacitors 111 and 112 are coupled to receive a control gate signal CG.

Each of the high-voltage p-channel transistors 101–104 has a relatively thick gate oxide, which enables these transistors to operate in response to voltages much greater than the nominal supply voltage. For example, if product term cell 100 normally operates in response to a nominal supply voltage of 1.8 Volts, then high-voltage p-channel transistors 101–104 are capable of operating in response to voltages of 12–14 Volts, without adverse effects.

P-channel transistors 101–102 and n-channel transistors 105–106 are connected in series between a $V_{DD}$ terminal (which receives a $V_{DD}$ signal) and a ground voltage supply terminal (which is maintained at a ground supply voltage of 0 Volts). Similarly, p-channel transistors 103–104 and n-channel transistors 107–108 are connected in series between the $V_{DD}$ terminal and the ground voltage supply terminal. The n-type body regions of p-channel transistors 101–104 are coupled to the $V_{DD}$ terminal. In the described embodiment, each of transistors 101–108 has a width-to-length ratio of 0.56/0.5. However, these transistors can have other width-to-length ratios in other embodiments.

The gates of p-channel transistor 102 and n-channel transistor 105 are commonly coupled to a $Z_{IN}$ input terminal (which receives an input signal $Z_{IN}$). The gates of p-channel transistor 104 and n-channel transistor 107 are commonly coupled to a $Z_{IN\#}$ input terminal (which receives an input signal $Z_{IN\#}$ that is typically the inverse of the input signal $Z_{IN}$). The drains of transistors 102, 104, 105 and 107 are commonly connected to an output terminal 130, which provides an output signal (OUT). In some embodiments, the $Z_{IN\#}$ input signal may be provided by an inverter coupled between the $Z_{IN}$ and $Z_{IN\#}$ input terminals.

Product term cell 100 is initially erased as follows. The $PBIT_L$ and $PBIT_R$ signals are connected to receive the ground supply voltage (0 Volts), the $V_{DD}$ terminal is left floating, and the control gate voltage CG is raised to a programming voltage $V_{PP}$ of about 12–14 Volts for about 100 milliseconds (msec). Under these conditions, electrons travel from the first terminals of tunnel oxide capacitor elements 121 and 122 toward the control gate terminal CG, and are trapped on the left floating gate $FG_L$ and the right floating gate $FG_R$, respectively. The negative electronic charge on left floating gate $FG_L$ lowers the threshold voltage of p-channel transistor 101 and raises the threshold voltage of n-channel transistor 108. Similarly, the negative electronic charge on right floating gate $FG_R$ lowers the threshold voltage of p-channel transistor 103 and raises the threshold voltage of n-channel transistor 106.

Product term cell 100 can then be programmed as follows. The control gate voltage CG is initially raised to ½ the programming voltage $V_{PP}$, or about 6–7 Volts. The $PBIT_L$ signal is then raised from the ground supply voltage to the programming voltage $V_{PP}$ (12–14 Volts) if the left floating gate $FG_L$ is to be programmed. Similarly, the $PBIT_R$ signal is raised from the ground supply voltage to the programming voltage $V_{PP}$ (12–14 Volts) if the right floating gate $FG_R$ is to be programmed. If neither the left floating gate $FG_L$ nor the right floating gate $FG_R$ is to be programmed, then both the $PBIT_L$ and the $PBIT_R$ signals remain at the ground supply voltage.

After the $PBIT_L$ and $PBIT_R$ signals have been set, the control gate voltage CG is lowered to the ground supply voltage (0 Volts). At this time, the left floating gate $FG_L$ is programmed if the $PBIT_L$ signal is raised to the programming voltage $V_{PP}$, and the right floating gate $FG_R$ is programmed if the $PBIT_R$ signal is raised to the programming voltage $V_{PP}$. During the programming operation, negative electronic charge is removed from the associated floating gate. For example, if the left floating gate $FG_L$ is programmed, negative electronic charge is removed from this floating gate. As a result, the threshold voltage of p-channel transistor 101 is raised, and the threshold voltage of n-channel transistor 108 is lowered. If the $PBIT_L$ (or $PBIT_R$) signal remains at the ground supply voltage, then the associated floating gate $FG_L$ (or $FG_R$) remains in the erased state, and is not programmed. The program operation requires approximately 10 msec. When the program operation is complete, the control gate voltage CG is raised back to a voltage of ½ $V_{PP}$.

Figure 2:
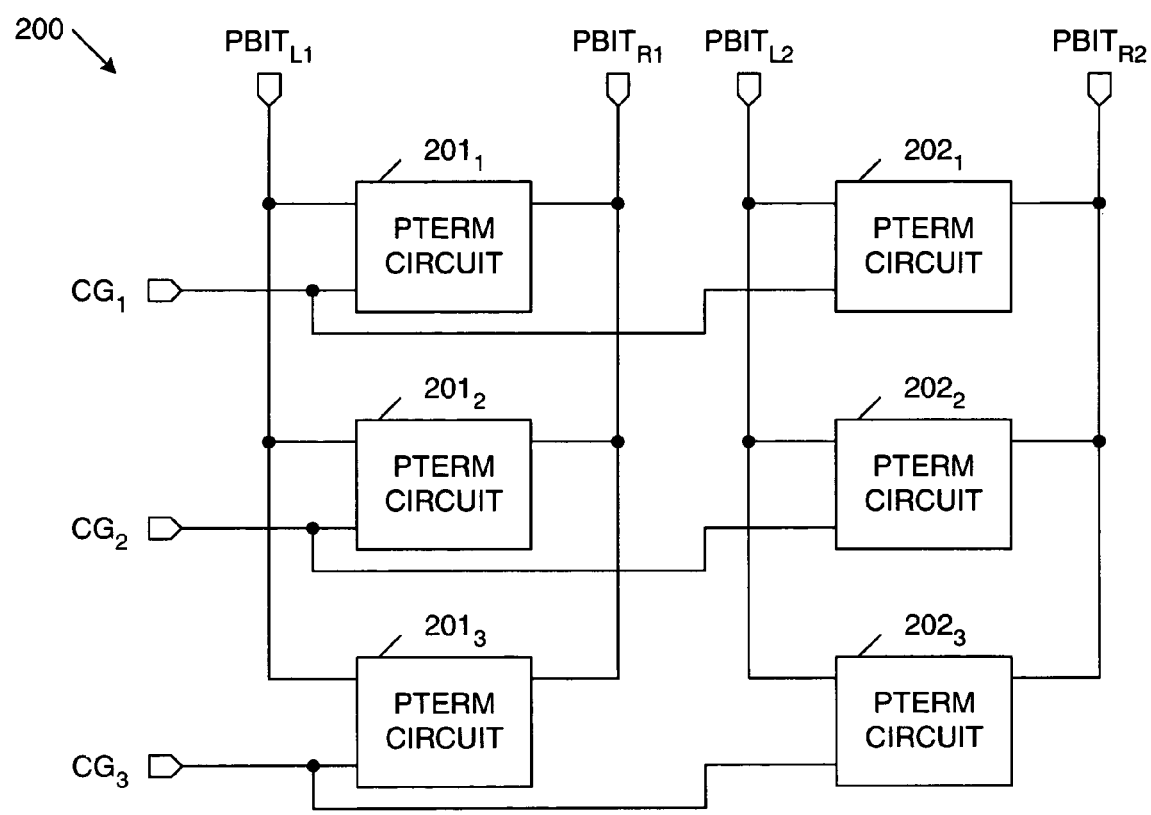
FIG. 2 is a block diagram of a 3×2 array of product term cells, each of which is substantially identical to the product term cell of FIG. 1.

FIG. 2 is a block diagram of a 3×2 array 200 of product term cells $201_1$–$201_3$, $202_1$–$202_3$ each of which is substantially identical to product term cell 100. Although a 3×2 array is illustrated, it is understood that this array can be expanded or contracted as necessary in view of the following teachings. In the illustrated embodiment, the product term cells $201_1$–$201_3$ of the first column are commonly coupled to receive the $PBIT_{L1}$ and $PBIT_{R1}$ signals. Similarly, the product term cells $202_1$–$202_3$ of the second column are commonly coupled to receive the $PBIT_{L2}$ and $PBIT_{R2}$ signals. Each row of product term cells $201_1$–$202_1$, $201_2$–$202_2$, and $201_3$–$202_3$ is coupled to receive a corresponding control gate signal $CG_1$, $CG_2$ and $CG_3$, respectively.

Array 200 is programmed on a row-by-row basis in the described embodiment. While the first row of product term cells $201_1$–$202_1$ is being programmed in the manner described above, control gate signals $CG_2$ and $CG_3$ for the other rows are all held at a voltage of about ½ $V_{PP}$, such that the associated product term cells $201_2$–$202_2$ and $201_3$–$202_3$ are not subjected to programming conditions.

After the first row of product term cells $201_1$–$202_1$ has been programmed, the $CG_1$ signal is raised back to a voltage of ½ $V_{PP}$. The second row of product term cells $201_2$–$202_2$ is then programmed in the manner described above, with control gate signals $CG_1$ and $CG_3$ being held at a voltage of about ½ $V_{PP}$, such that the associated product term cells $201_1$–$202_1$ and $201_3$–$202_3$ are not subjected to programming conditions.

After the second row of product term cells $201_2$–$202_2$ has been programmed, the $CG_2$ signal is raised back to a voltage of ½ $V_{PP}$. The third row of product term cells $201_2$–$202_2$ is then programmed in the manner described above. After the third row of product term cells has been programmed, the $PBIT_{L1}$–$PBIT_{L2}$ and $PBIT_{R1}$–$PBIT_{R2}$ signals brought to the ground supply voltage. Then, the control gate signals $CG_1$–$CG_3$ are brought to the ground supply voltage. The $PBIT_{L1}$–$PBIT_{L2}$ and $PBIT_{R1}$–$PBIT_{R2}$ signals must be at the ground supply voltage before returning all of the control gate signals $CG_1$–$CG_3$ to the ground supply voltage to avoid mis-programming any cells.

After product term cell 100 has been erased/programmed, this product term cell is configured for normal operation. During normal operation, the $V_{DD}$ terminal and the control gate terminal CG are coupled to receive the $V_{DD}$ supply voltage (e.g., 1.8 Volts) and the $PBIT_L$ and $PBIT_R$ terminals are coupled to receive the ground supply voltage. Under these conditions, the logical operation of product term cell 100 depends on the programmed or erased state of the floating gates $FG_L$ and $FG_R$. Table 1 below defines the manner in which the output signal OUT is provided in response to the input signals $Z_{IN}/Z_{IN\#}$ for the various programmed/erased states of floating gates $FG_L$ and $FG_R$. In general, by setting the states of the floating gates appropriately, the product term cell 100 may be configured to provide one of a constant logic high, a constant logic low, $Z_{IN}$, or $Z_{IN\#}$ as the output signal OUT.

TABLE 1

| $FG_L$ | $FG_R$ | $Z_{IN}$ | $Z_{IN\#}$ | OUT |
|---|---|---|---|---|
| ERASED | ERASED | 0 | 1 | 1 (=1) |
| ERASED | ERASED | 1 | 0 | 1 (=1) |
| ERASED | PROGRAMMED | 0 | 1 | 1 (=$Z_{IN\#}$) |
| ERASED | PROGRAMMED | 1 | 0 | 0 (=$Z_{IN\#}$) |
| PROGRAMMED | ERASED | 0 | 1 | 0 (=$Z_{IN}$) |
| PROGRAMMED | ERASED | 1 | 0 | 1 (=$Z_{IN}$) |
| PROGRAMMED | PROGRAMMED | 0 | 1 | 0 (=0) |
| PROGRAMMED | PROGRAMMED | 1 | 0 | 0 (=0) |

When the floating gates $FG_L$ and $FG_R$ are both erased, both p-channel transistors 101 and 103 are in a conductive state, and both n-channel transistors 106 and 108 are in a non-conductive state. Since $Z_{IN\#}$ is the inverse of $Z_{IN}$, the $Z_{IN}/Z_{IN\#}$ signals always turn on one of the p-channel transistors 102 or 104, thereby coupling the output terminal 130 to the $V_{DD}$ terminal. As a result, a logic high ("1") output signal OUT is provided, regardless of the state of the $Z_{IN}/Z_{IN\#}$ signals.

Conversely, when the floating gates $FG_L$ and $FG_R$ are both programmed, both n-channel transistors 106 and 108 are in a conductive state, and both p-channel transistors 101 and 103 are in a non-conductive state. Again, since $Z_{IN\#}$ is the inverse of $Z_{IN}$, the $Z_{IN}/Z_{IN\#}$ signals always turn on one of the n-channel transistors 105 or 107, thereby coupling the output terminal 130 to the ground voltage supply terminal. As a result, a logic low ("0") output signal OUT is provided, regardless of the state of the $Z_{IN}/Z_{IN\#}$ signals.

When the left floating gate $FG_L$ is erased and the right floating gate $FG_R$ is programmed, p-channel transistor 101 and n-channel transistor 106 are each in a conductive state, and p-channel transistor 103 and n-channel transistor 108 are each in a non-conductive state. In this case, the product term cell is responsive to the $Z_{IN}$ signal. Thus, if the $Z_{IN}$ signal has a logic low state, then p-channel transistors 101 and 102 are both in a conductive state (and n-channel transistor 105 is in a non-conductive state), such that the output terminal 130 is pulled up to the $V_{DD}$ supply voltage. Conversely, if the $Z_{IN}$ signal has a logic high state, then n-channel transistors 105 and 106 are both in a conductive state (and p-channel transistor 102 is in a non-conductive state), such that the output terminal 130 is pulled down to the ground supply voltage. Thus, the output signal OUT is equal to the inverse of the $Z_{IN}$ signal (or $Z_{IN\#}$).

When the right floating gate $FG_R$ is erased and the left floating gate $FG_L$ is programmed, p-channel transistor 103 and n-channel transistor 108 are each in a conductive state, and p-channel transistor 101 and n-channel transistor 106 are each in a non-conductive state. In this case, the product term cell is responsive to the $Z_{IN\#}$ signal. Thus, if the $Z_{IN\#}$ signal has a logic low state, then p-channel transistors 103 and 104 are both in a conductive state (and n-channel transistor 107 is in a non-conductive state), such that the output terminal 130 is pulled up to the $V_{DD}$ supply voltage. Conversely, if the $Z_{IN\#}$ signal has a logic high state, then n-channel transistors 107 and 108 are both in a conductive state (and p-channel transistor 104 is in a non-conductive state), such that the output terminal 130 is pulled down to the ground supply voltage. Thus, the output signal OUT is equal to the inverse of the $Z_{IN\#}$ signal (or $Z_{IN}$)

Figure 3:
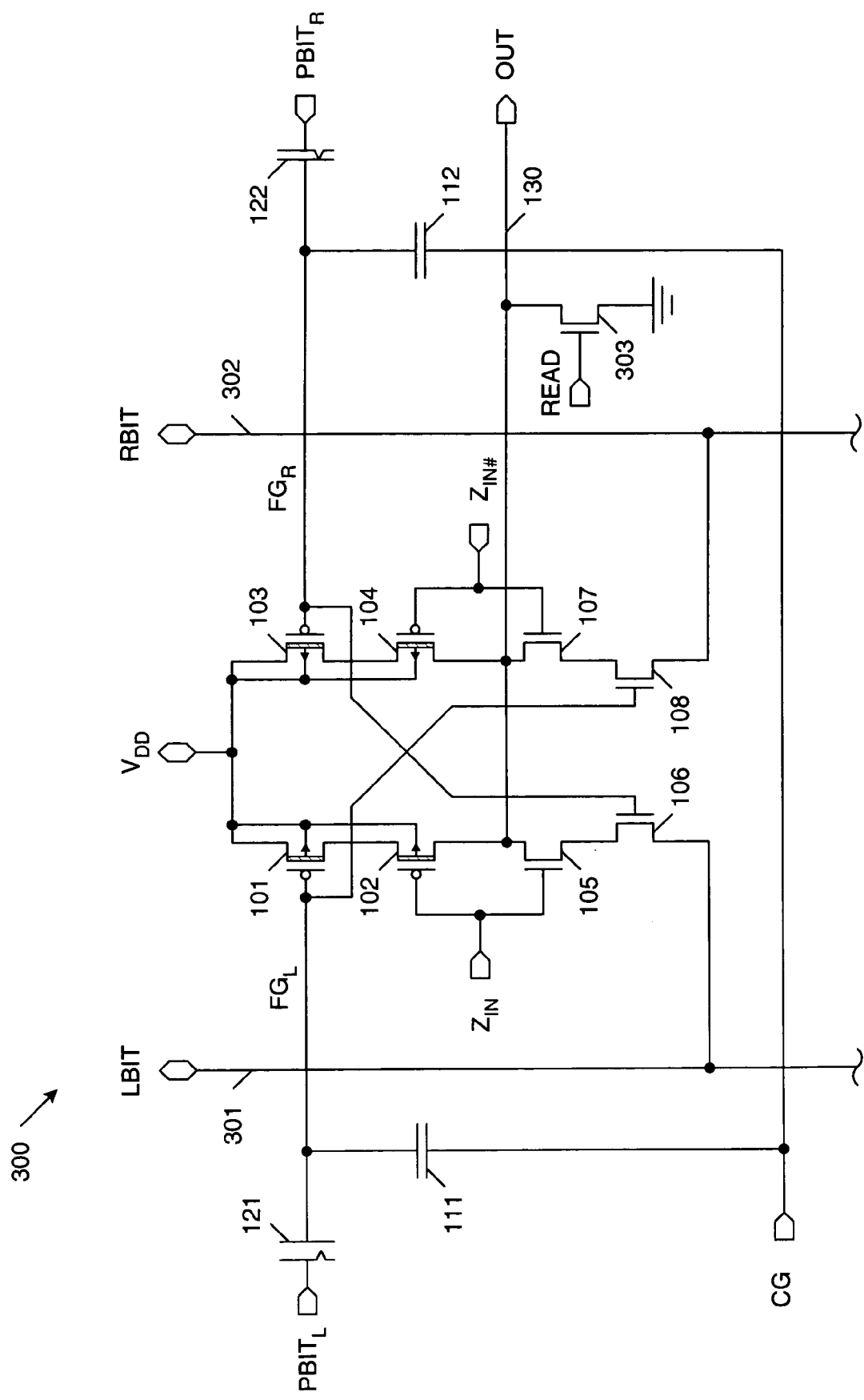
FIG. 3 is a circuit diagram of a product term cell in accordance with another embodiment of the present invention.

FIG. 3 is a circuit diagram of a symmetrical product term cell 300 in accordance with another embodiment of the present invention. Because product term cell 300 (FIG. 3) is similar to product term cell 100 (FIG. 1), similar elements in FIGS. 1 and 3 are labeled with similar reference numbers. Thus, product term cell 300 includes high-voltage p-channel transistors 101–104, n-channel transistors 105–108, capacitors 111–112, and tunnel oxide capacitor elements 121–122. In addition, product term cell 300 includes left bit line 301, right bit line 302 and n-channel read transistor 303. The sources of n-channel transistors 106 and 108 are coupled to left bit line 301 and right bit line 302, respectively (rather than to the ground supply voltage terminal, as in pterm cell 100 of FIG. 1). N-channel read transistor 303 has a source coupled to the ground voltage supply terminal, a drain coupled to the output terminal 130 and a gate coupled to receive a read control signal (READ).

Product term cell 300 is erased and programmed in the same manner as product term cell 300. During erase and program operations, the LBIT and RBIT signals on left bit line 301 and right bit line 302 are held at the ground supply voltage, and the READ control signal is held at a logic low state, thereby turning off read transistor 303.

After product term cell 300 has been erased/programmed, this product term cell is configured for normal operation. During normal operation, the $V_{DD}$ terminal and the control gate terminal CG are coupled to receive the $V_{DD}$ supply voltage (e.g., 1.8 Volts) and the $PBIT_L$, $PBIT_R$, LBIT, RBIT and READ signals are held at the ground supply voltage. Under these conditions, the logical operation of product term cell 300 depends on the programmed or erased state of floating gates $FG_L$ and $FG_R$. Product term cell 300 operates in accordance with Table 1 above (i.e., in the same manner as product term cell 100 of FIG. 1).

In addition, product term cell 300 allows for the state of its floating gates to be read. The programmed/erased states of floating gates $FG_L$ and $FG_R$ of product term cell 300 can be read as follows. The $Z_{IN}$, $Z_{IN\#}$, READ and CG signals are held at the $V_{DD}$ supply voltage, and the $PBIT_L$ and $PBIT_R$ signals are held at the ground supply voltage. The logic high $Z_{IN}$ and $Z_{IN\#}$ signals turn on n-channel transistors 105 and 107, and turn off p-channel transistors 102 and 104. The logic high READ signal turns on read transistor 303, such that the ground supply voltage is applied to the drains of n-channel transistors 106 and 108. If left floating gate $FG_L$ is programmed, then the $V_{DD}$ supply voltage applied to the control gate terminal CG will cause n-channel transistor 108 to be in a conductive state. As a result, the right bit line 302 will be pulled down to the ground supply voltage. Similarly, if right floating gate $FG_R$ is programmed, then the $V_{DD}$ supply voltage applied to the control gate terminal CG will cause n-channel transistor 106 to be in a conductive state. As a result, the left bit line 301 will be pulled down to the ground supply voltage.

In contrast, if left floating gate $F_{GL}$ is erased, then the $V_{DD}$ supply voltage applied to the control gate terminal CG will not be sufficient to turn on n-channel transistor 108. As a result, the right bit line 302 remains floating (i.e., is not pulled down to the ground supply voltage). If right floating gate $F_{GR}$ is erased, then the $V_{DD}$ supply voltage applied to the control gate terminal CG will not be sufficient to turn on n-channel transistor 106. As a result, the left bit line 301 remains floating (i.e., is not pulled down to the ground supply voltage).

As is known in the art, conventional sense amplifier circuitry (not shown) may be coupled to the left and right bit lines 301 and 302 to sense the states of the LBIT and RBIT signals. A ground voltage state identifies a programmed state of the associated floating gate, and a floating state identifies an erased state of the associated floating gate. For example, the left and right bit lines 301 and 302 may be pre-charged, and held at the pre-charge voltage by associated half-latch circuits (not shown). A programmed floating gate will result in the associated bit line being pulled down to ground, while an erased floating gate will result in the associated bit line remaining pulled up to the pre-charge voltage.

Having the $Z_{IN}$ and $Z_{IN\#}$ signals at the $V_{DD}$ supply voltage during the read operation turns off any possible current path through the p-channel transistors 101–104 of product term cell 300. One advantage of product term cell 300 is the ability to margin test the strength of the programmed floating gate n-channel transistors 106 and 108 by selecting different control gate voltages CG during a read operation. That is, the control gate voltage CG can be reduced during successive read operations to determine the minimum control gate voltage CG that will cause the sense amplifier to properly identify the programmed states of floating gate n-channel transistors 106 and 108.

Figure 4:
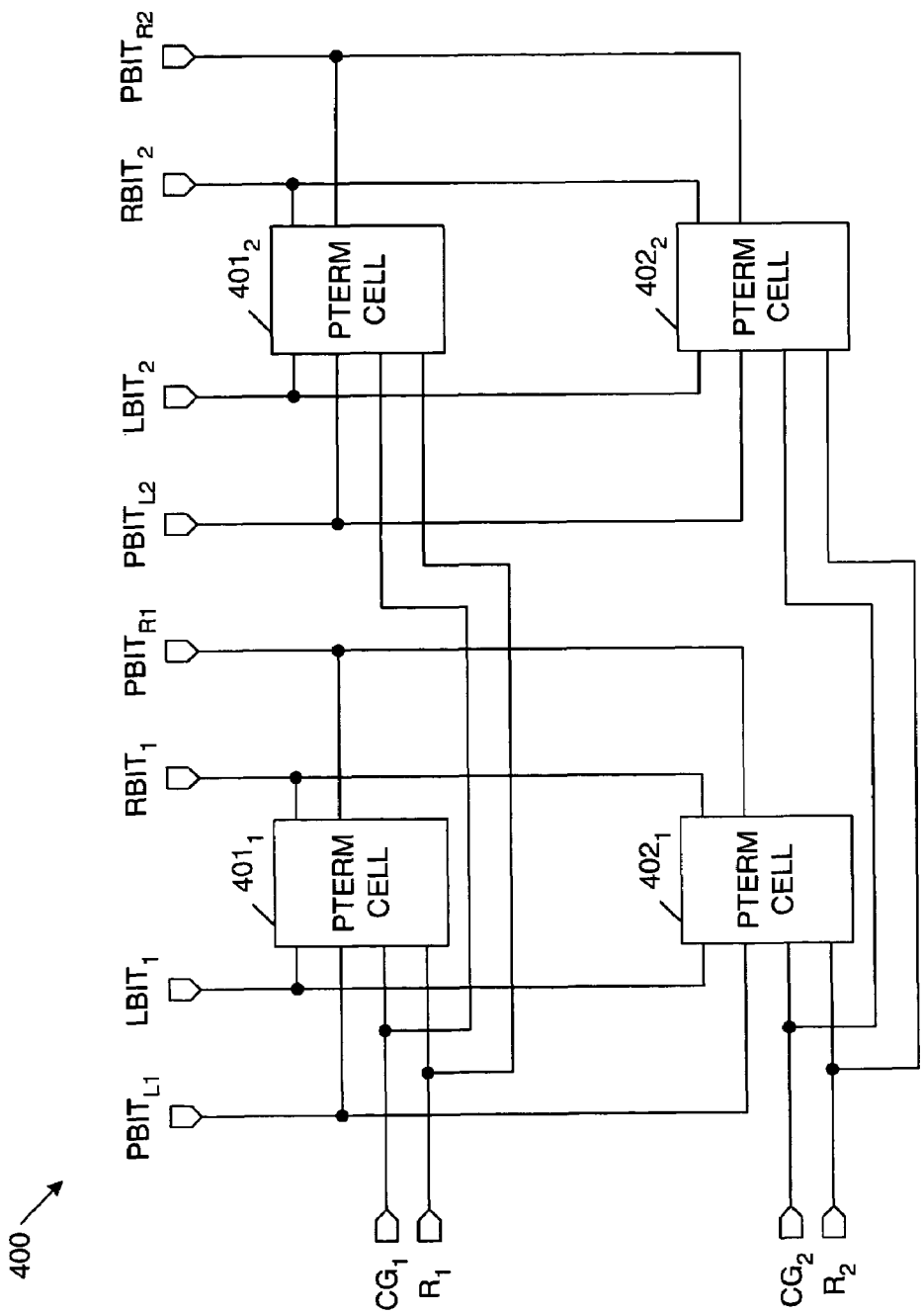
FIG. 4 is a block diagram of a 2×2 array of product term cells, each of which is substantially identical to the product term cell of FIG. 3.

FIG. 4 is a block diagram of a 2×2 array 400 of product term cells $401_1$–$401_2$, $402_1$–$402_2$ each of which is substantially identical to product term cell 300. Although a 2×2 array is illustrated, it is understood that this array can be expanded or contracted as necessary in view of the following teachings. In the illustrated embodiment, the product term cells $401_1$–$402_1$ of the first column are commonly coupled to receive the $PBIT_{L1}$, $PBIT_{R1}$, $LBIT_1$ and $RBIT_1$ signals. Similarly, the product term cells $401_2$–$402_2$ of the second column are commonly coupled to receive the $PBIT_{L2}$, $PBIT_{R2}$, $LBIT_2$ and $RBIT_2$ signals. Each row of product term cells $401_1$–$401_2$ and $402_1$–$402_2$ is coupled to receive a corresponding control gate signal $CG_1$ and $CG_2$, respectively, and a corresponding read control signal $R_1$ and $R_2$, respectively.

Array 400 is programmed on a row-by-row basis in the same manner described above for array 200. Note that the $LBIT_1$–$LBIT_2$. $RBIT_1$–$RBIT_2$ and $R_1$–$R_2$ signals are all held at the ground supply voltage during the programming operations.

Array 400 is also read on a row-by-row basis. For example, the first row of product term cells $401_1$–$401_2$ is read as follows. The $Z_{IN}$ and $Z_{IN\#}$ signals associated with each of product term cells $401_1$–$401_2$ and the read control signal $R_1$ are activated high ($V_{DD}$) to read the first row. The $Z_{IN}$ and $Z_{IN\#}$ signals associated with each of product term cells $402_1$–$402_2$ and the read control signal $R_2$ are deactivated low (ground), since the second row is not being read. The control gate signal $CG_1$ is held at the $V_{DD}$ supply voltage. The control gate signal $CG_2$ and the $PBIT_{L1}$–$PBIT_{L2}$ and $PBIT_{R1}$–$PBIT_{R2}$ signals are held at the ground supply voltage. Under these conditions, the contents of product term cells $401_1$ and $401_2$ can be read on bit lines $LBIT_1$–$RBIT_1$ and $LBIT_2$–$RBIT_2$ in the manner described above.

Although the invention has been described in connection with several embodiments, it is understood that this invention is not limited to the embodiments disclosed, but is capable of various modifications, which would be apparent to one of ordinary skill in the art. Thus, the present invention is only limited by the following claims.

I claim:

1. A product term cell comprising:
   a first floating gate structure located over a first p-channel transistor and a first n-channel transistor;
   a second floating gate structure located over a second p-channel transistor and a second n-channel transistor;
   a control gate structure capacitively coupled to the first and second floating gate structures;
   a first tunnel oxide capacitor formed with the first floating gate structure;
   a second tunnel oxide capacitor formed with the second floating gate structure;
   a first transistor pair coupled between the first p-channel transistor and the second n-channel transistor; and
   a second transistor pair coupled between the second p-channel transistor and the first n-channel transistor.

2. The product term cell of claim 1, wherein source regions of the first p-channel transistor and the second p-channel transistor are coupled to a positive voltage supply terminal.

3. The product term cell of claim 1, wherein source regions of the first n-channel transistor and the second n-channel transistor are coupled to a ground supply terminal.

4. The product term cell of claim 1, wherein a source region of the first n-channel transistor is coupled to a first bit line, and a source region of the second n-channel transistor is coupled to a second bit line.

5. The product term cell of claim 1, wherein the first transistor pair comprises:
a third p-channel transistor coupled between the first p-channel transistor and a first node; and
a third n-channel transistor coupled between the first node and the second n-channel transistor.

6. The product term cell of claim 5, wherein the second transistor pair comprises:
a fourth p-channel transistor coupled between the second p-channel transistor and a second node; and
a fourth n-channel transistor coupled between the second node and the first n-channel transistor.

7. The product term cell of claim 6, further comprising:
a first input terminal coupled to gates of the third p-channel transistor and the third n-channel transistor; and
a second input terminal coupled to gates of the fourth p-channel transistor and the fourth n-channel transistor.

8. The product term cell of claim 7, further comprising an inverter coupled between the first and second input terminals.

9. The product term cell of claim 6, further comprising an output terminal coupled to the first node and the second node.

10. The product term cell of claim 9, further comprising a read transistor coupled to the output terminal.

11. The product term cell of claim 10, wherein the read transistor comprises a fifth n-channel transistor having a source coupled to the ground supply voltage terminal, a drain coupled to the output terminal and a gate coupled to receive a read control signal.

12. A method of operating a product term cell having a first floating gate element and a second floating gate element, the method comprising:
erasing the first floating gate element, wherein erasing the first floating gate enables a first p-channel floating gate transistor that includes the first floating gate element and disables a first n-channel floating gate transistor that includes the first floating gate element; and
erasing the second floating gate element, wherein the erased second floating gate enables a second p-channel floating gate transistor that includes the second floating gate element and disables a second n-channel floating gate transistor that includes the second floating gate element.

13. The method of claim 12, further comprising providing an output signal having a first logic state through the enabled first p-channel floating gate transistor or the enabled second p-channel floating gate transistor.

14. The method of claim 12, further comprising:
programming the first floating gate element, wherein the programmed first floating gate element disables the first p-channel floating gate transistor and enables the first n-channel floating gate transistor; and
applying a first input signal to a first transistor pair coupled between the second p-channel floating gate transistor and the first n-channel floating gate transistor.

15. The method of claim 14, further comprising providing an output signal through the enabled first n-channel floating gate transistor or the enabled second p-channel floating gate transistor, in response to the first input signal.

16. The method of claim 14, further comprising:
programming the second floating gate element, wherein the programmed second floating gate element disables the second p-channel floating gate transistor and enables the second n-channel floating gate transistor; and applying a second input signal, complementary to the first input signal to a second transistor pair coupled between the first p-channel floating gate transistor and the second n-channel floating gate transistor.

17. The method of claim 16, further comprising providing an output signal having a second logic state through the enabled first n-channel floating transistor or the second n-channel floating transistor.

18. The method of claim 16, further comprising determining whether the first and second floating gate elements are programmed or erased.

19. The method of claim 18, wherein the step of determining whether the first and second floating gate elements are programmed or erased comprises selecting the first and second input signals to have substantially equal voltage levels.

20. The method of claim 16, further comprising margin testing the programmed first and second floating gate elements.

21. The method of claim 20, wherein the margin testing comprises:
applying a first read voltage to a control gate located over the first and second floating gate elements during a first read operation;
determining the presence of a read current above a threshold level during the first read operation;
applying a second read voltage, less than the first read voltage, to the control gate during a second read operation; and
determining the absence of a read current above the threshold level during the second read operation.

22. The method of claim 14, wherein the step of programming the first floating gate element comprises:
applying a positive intermediate voltage to a control gate located over the first and second floating gate elements;
applying a positive programming voltage to a first tunnel oxide capacitor formed with the first floating gate element, the programming voltage being greater than the intermediate voltage; and then
lowering the voltage applied to the control gate to the ground supply voltage (0 Volts).

23. The method of claim 12, wherein the steps of erasing the first and second floating gate elements further comprise applying a first erase voltage to a control gate located over the first and second floating gate elements.

24. The method of claim 23, wherein the steps of erasing the first and second floating gate elements further comprise applying a second erase voltage to a first tunnel oxide capacitor coupled to the first floating gate element, and to a second tunnel oxide capacitor coupled to the second floating gate element.

25. A product term cell comprising:
means for storing a first charge that adjusts the threshold voltages of a first p-channel transistor and a first n-channel transistor;
means for storing a second charge that adjusts the threshold voltages of a second p-channel transistor and a second n-channel transistor;
means for selectively coupling either the first p-channel transistor or the second n-channel transistor to an output terminal; and
means for selectively coupling either the second p-channel transistor or the first n-channel transistor to the output terminal.

* * * * *